United States Patent [19]

Farb et al.

[11] Patent Number: 5,511,036
[45] Date of Patent: Apr. 23, 1996

[54] FLASH EEPROM CELL AND ARRAY WITH BIFURCATED FLOATING GATES

[75] Inventors: Joseph E. Farb, Riverside; Chen-chi P. Chang, Newport Beach; Mei F. Li, Mission Viejo, all of Calif.

[73] Assignee: Hughes Aircraft Company, Los Angeles, Calif.

[21] Appl. No.: 357,825

[22] Filed: Dec. 19, 1994

[51] Int. Cl.⁶ .................................................. H01L 29/78
[52] U.S. Cl. ...................................... 365/185.1; 257/316
[58] Field of Search .............................. 365/182, 185, 365/900; 257/317, 314, 316

[56] References Cited

U.S. PATENT DOCUMENTS

| | | | |
|---|---|---|---|
| 4,087,795 | 5/1978 | Rossler | 365/185 |
| 5,343,424 | 8/1994 | Chang et al. | 365/182 |
| 5,378,909 | 1/1995 | Chang et al. | 257/316 |

OTHER PUBLICATIONS

Authors: Gheorghe Samachisa, Chien–Sheng Su, Yu Sheng Kao, George Smarandoiu, Chen–Yuan Michae Wang, Ting Wong Chenming Hu "A 128K Flash EEPROM Using Double–Polysilicon Technology". Published in IEEE J. Solid–State Circuits vol. SC–22, No. 5, pp. 676–683; Oct., 1987.
Authors: H. Kume, H. Yamamoto, T. Adachi, T. Hagiwara, K. Komori, T. Nishimoto, A. Koike, S. Meguro, T. Hayashida, T. Tsukada "A Flash–Erase EEPROM Cell With a Asymmetric Source and Drain Structure". 1987 Central Research Laboratory, Hitachi, Ltd., Kokubunji, Tokyo 185 Japan.

Primary Examiner—Viet Q. Nguyen
Attorney, Agent, or Firm—M. E. Lachman; M. W. Sales; W. K. Denson-Low

[57] ABSTRACT

Each unit cell (10) of a flash EEPROM array (50) includes a source (18), a drain (20) and a channel (22) formed in a substrate (12). A thin tunnel oxide layer (32) is formed over the substrate (12) and P-Well (14). A bifurcated floating gate (34) is formed on the tunnel oxide layer (32) overlying the channel (22), and includes a program arm (34a) which overlaps the drain (20), an erase arm (34b) which overlaps the source (18) and a base (34c) which extends around an end of the channel (22) and interconnects the program and erase arms (34a,34b). A thick gate oxide layer (36,36a) is formed over the floating gate (34), and a control gate (38) is formed over the gate oxide layer (36,36a). A central section of the control gate (38) which overlies a gap (34d) between the program and erase arms (34a, 34b) provides threshold voltage control for erasure. The erase arm (34b) spans the entire width of the channel (22), enabling erasure with low applied voltages. The bifurcated floating gate design automatically compensates for alignment error during fabrication such that the relative areas of the channel (22) which underlie the program/erase arms (34a, 34b) and gap (34d) are independent of the location of the gap (34d).

19 Claims, 5 Drawing Sheets

FLASH EEPROM CELL AND ARRAY WITH BIFURCATED FLOATING GATES

BACKGROUND OF THE INVENTION

1. Field of the Invention

The present invention generally relates to the art of semiconductor memories, and more specifically to a flash or block erase electrically erasable programmable read-only memory (EEPROM) cell and array with bifurcated floating gates.

2. Description of the Related Art

A flash or block erase EEPROM semiconductor memory includes an array of cells which can be independently programmed and read. The size of each cell and thereby the memory are made small by omitting select transistors which would enable the cells to be erased independently. All of the cells are erased together as a block.

A conventional flash EEPROM is described in an article entitled "A FLASH-ERASE EEPROM CELL WITH AN ASYMMETRIC SOURCE AND DRAIN STRUCTURE", by H. Kume et al, IEDM, 25.8, 1987, pp. 560–563. Each cell includes a source and a drain which are formed on opposite sides of a channel region in a substrate. A thin tunnel oxide layer, a floating gate, a thick gate oxide layer and a control gate are formed over the channel region.

The cell is programmed by applying, typically, 12 V to the control gate, 6 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 6 V.

The cell is read by applying 5 V to the control gate and 1 V to the drain, and sensing the impedance of the cell at the source. If the cell is programmed and the threshold voltage (6 V) is higher than the control gate voltage (5 V), the control gate voltage will be insufficient to enhance the channel and the cell will appear as a high impedance. If the cell is not programmed or erased, the threshold voltage will be low, the control gate voltage will enhance the channel and the cell will appear as a low impedance.

The cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source.

A problem with the conventional flash EEPROM cell configuration is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

A known method of preventing over-erasure is to provide an adaptive erasing algorithm in which the erasing voltages are applied to the control gates as a series of pulses of varying period. This method is complicated and requires additional circuitry for generating the erase pulses in accordance with the algorithm.

The effects of over-erasure can be compensated for by means of a split-gate (also known as stacked- or pass-gate) configuration in which a section of the control gate is disposed in series between the source and the floating gate. The region of the channel which underlies the series section of the control gate can be turned off by the control gate voltage, thereby providing the cell with a stable threshold voltage after erasure and minimizing leakage. A typical split-gate EEPROM is described in an article entitled "A 128 K Flash EEPROM Using Double-Polysilicon Technology", by G. Samacisa et al, IEEE J. Solid-State Circuits, Vol. SC-22, No. 5, Oct. 1987, pp. 676–683.

Although achieving stable erasure without the necessity of utilizing an adaptive algorithm, a split-gate EEPROM requires higher applied voltages to achieve erasure than the basic EEPROM. This is because the floating gate is spaced from the source by the series section of the control gate and the intervening gate oxide layer. A higher potential difference is required to accomplish erasure by Fowler-Nordheim tunneling through the thick gate oxide layer of the split-gate EEPROM than through the thin tunnel oxide layer of the basic EEPROM.

SUMMARY OF THE INVENTION

A flash EEPROM cell embodying the present invention achieves the controlled erasure of the split-gate configuration with the low applied voltages of the basic design.

More specifically, a flash EEPROM unit cell of the invention includes a source, a drain and a channel formed in a substrate. A thin tunnel oxide layer is formed over the substrate. A bifurcated floating gate is formed on the tunnel oxide layer overlying the channel, and includes a program arm which overlaps the drain, an erase arm which overlaps the source and a base which extends around an end of the channel and interconnects the program and erase arms.

A thick gate oxide layer is formed over the floating gate, and a control gate is formed over the gate oxide layer. A section of the control gate which overlies a gap between the program and erase arms provides threshold voltage control for erasure. The erase arm spans the entire width of the channel, enabling erasure with low applied voltages.

The bifurcated floating gate design automatically compensates for alignment error during fabrication such that the relative areas of the channel which underlie the program/erase arms and gap are independent of the location of the gap.

These and other features and advantages of the present invention will be apparent to those skilled in the art from the following detailed description, taken together with the accompanying drawings in which like reference numerals refer to like parts.

DETAILED DESCRIPTION OF THE INVENTION

Figure 1:
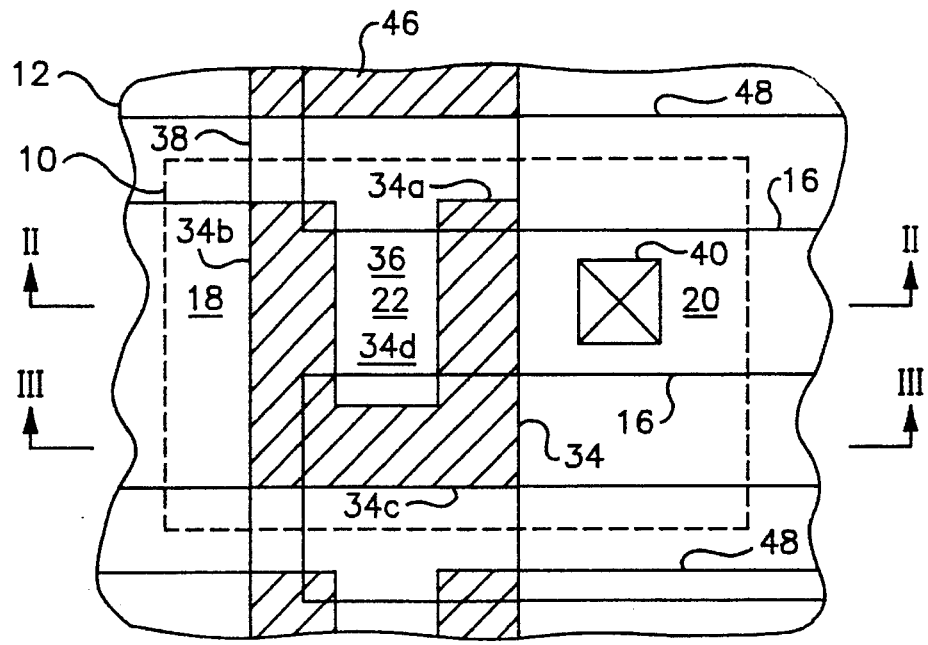
FIG. 1 is a diagram illustrating an EEPROM unit cell embodying the present invention with a floating gate thereof highlighted by diagonal hatching.

A flash electrically erasable programmable read-only memory (EEPROM) unit cell 10 and portions of adjacent cells of an EEPROM array embodying the present invention are illustrated in FIG. 1. As further illustrated in cross section in FIGS. 2 and 3, the cell 10 is formed in a substrate 12 of N- conductivity type. A lightly doped well 14 of P- conductivity type is formed in the substrate 12. Field oxide insulators 16 insulate the cell 10 from the adjacent cells. It is further within the scope of the invention to provide the substrate 12 of P- conductivity type, in which case the well 14 is unnecessary.

The cell 10 includes a source 18 and a drain 20 which are formed in the well 14, and a channel 22 which is defined in the well 14 between the source 18 and drain 20. The channel 22 has a program region 22a adjacent to the drain 20, an erase region 22b adjacent to the source 18 and a gap region 22c between the regions 22a and 22b. As best viewed in FIG. 2, the source 18 includes an N+ ohmic contact strata 24, and an underlying lightly doped N-strata 26 for reducing the electric field in the source depletion region and enabling a higher voltage to be applied to the source 18 for erasing the cell 10.

The drain 20 includes an N+ ohmic contact strata 28, and an underlying shield strata 30 which is doped P, the opposite conductivity type to the strata 28, for increasing the hot electron injection efficiency between the N+ strata 28 and the shield strata 30.

A tunnel oxide layer 32, having a thickness of typically 90-100 angstroms, is formed over the substrate 12 and the Well 14. A bifurcated polysilicon floating gate 34 is formed over the layer 32 and includes a program arm 34a which overlies the program region 22a of the channel 22 and overlaps the drain 20. The floating gate 34 further includes an erase arm 34b which overlies the erase region 22b of the channel 22 and overlaps the source 18, and a base 34c which extends around the lower end (as viewed in FIG. 1) of the channel 22 over the field oxide insulator 16 and interconnects the arms 34a and 34b. A gap 34d is defined between the arms 34a and 34b overlying the gap portion 22c of the channel 22.

A gate oxide layer 36, which typically has a thickness of 550 angstroms, is formed over the erase arm 34b of the floating gate 34 and the gap region 22c of the channel 22. An oxide layer 36a, which consists of three sublayers of oxide/nitride/oxide (ONO), extends from the layer 36 over the program arm 34a of the floating gate 34 for control gate and floating gate isolation. A polysilicon control gate 38 is formed over the gate oxide layer 36 and the ONO layer 36a. A metal drain contact 40 extends through a hole in the oxide layers composed of tunnel oxide 32 and boro-phosphoro-silicate glass (BSPG) which is not shown in the drawings.

Figure 2:
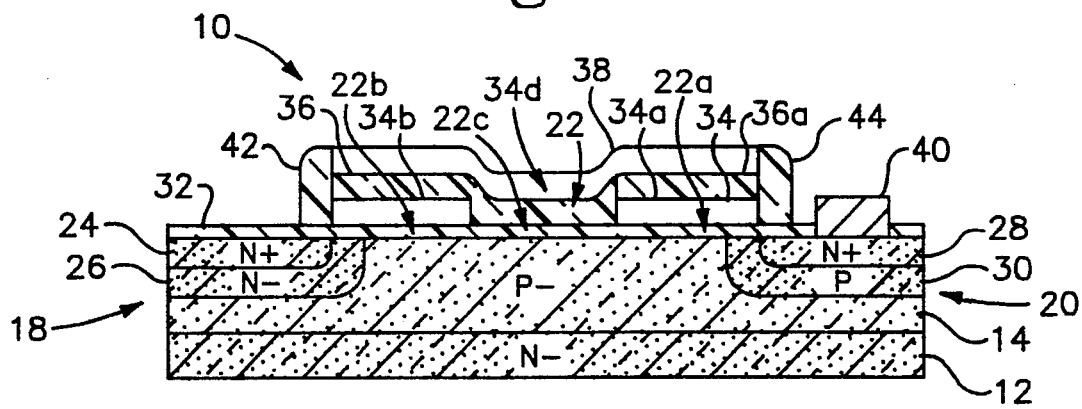
FIG. 2 is a section taken on a line II—II of FIG. 1.
Figure 3:
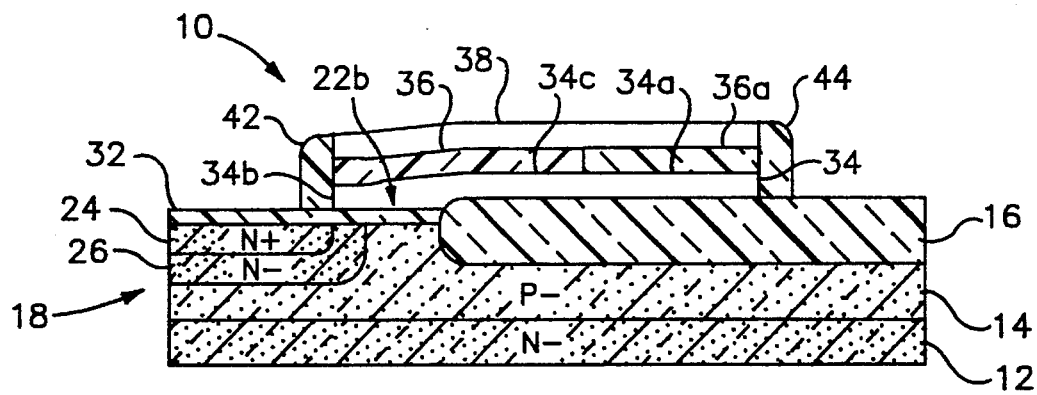
FIG. 3 is a section taken on a line III—III of FIG. 1.

Further illustrated in FIGS. 2 and 3 are oxide sidewall spacers 42 and 44 which facilitate the fabrication of the cell 10.

The polysilicon control gate 38 has a "split-gate" configuration, with the central portion of the gate 38 which overlies the gap region 22c of the channel 22 acting as a series enhancement mode gate which prevents the cell 10 from functioning as a depletion mode transistor if the floating gate 34 becomes over-erased.

The cell 10 is programmed by applying, typically, 12 V to the control gate 38, 5-6 V to the drain 20 and grounding the source 18. A high electric field is created in the drain depletion region between the drain 20 and the program arm 34a of the floating gate 34 by the applied voltages which causes impact ionization to occur in this region. Hole-electron pairs are created by the impact of the drain current in the high field region (they hit the silicon atoms). Some of the electrons generated by impact ionization are called "hot electrons".

The control gate voltage causes hot electrons to be injected from the drain depletion region into the floating gate 34 through the program arm 34a. These electrons are trapped in the floating gate 34 and create a negative charge therein which increases the threshold voltage of the cell 10.

The cell 10 is read by applying 5 V to the control gate 38 and 1-2 V to the drain 20, and sensing the impedance of the cell 10 at the source 18. If the cell 10 is programmed and the threshold voltage (>6 V) is higher than the control gate voltage (5 V), the control gate voltage will be insufficient to enhance the channel 22 and the cell 10 will appear as a high impedance. If the cell 10 is not programmed or erased, the threshold voltage will be low, the control gate voltage will enhance the channel 22 and the cell 10 will appear as a low impedance.

The cell 10 is erased by applying typically 12 V to the source 18, grounding the control gate 38 and allowing the drain 20 to float. This causes the electrons which were injected into the floating gate 34 during programming to be removed by Fowler-Nordheim tunneling from the erase arm 34b through the thin tunnel oxide layer 32 to the source 18. Due to the split-gate configuration of the control gate 38, the gap region 22c of the channel 22 which underlies the central portion of the control gate 38 can be turned off by a normal control gate voltage, thereby providing the cell 10 with a stable threshold voltage after erasure and minimizing leakage.

In accordance with the invention, erasure is accomplished by Fowler-Nordheim tunneling from the erase arm 34b of the floating gate 34 through the underlying tunnel oxide layer 32 to the source 18. Erasure can be accomplished with low applied voltages since the tunneling is only required to be performed through the thin oxide layer 32. The erase edge of the arm 34b spans the entire width of the channel 22, further reducing the voltages required for erasure.

In comparison, the conventional split-gate EEPROM configuration requires tunneling for erasure to be performed through the portion of the thick gate oxide layer 36 which overlies the gap region 22c of the channel 22. A much higher potential difference is required to produce Fowler-Nordheim tunneling through the 550 angstrom oxide layer 36 than through the 90 angstrom oxide layer 32. In this manner, the present cell 10 provides the threshold voltage control and over-erasure compensation of a split-gate EEPROM with the low voltage erasure of a basic EEPROM.

The design of the bifurcated floating gate 34 is further advantageous in that it automatically compensates for alignment error during fabrication of the cell 10 such that the relative areas of the channel 22 which underlie the arms 34a, 34b and gap 34d are independent of the location of the gap 34d.

Figure 4:
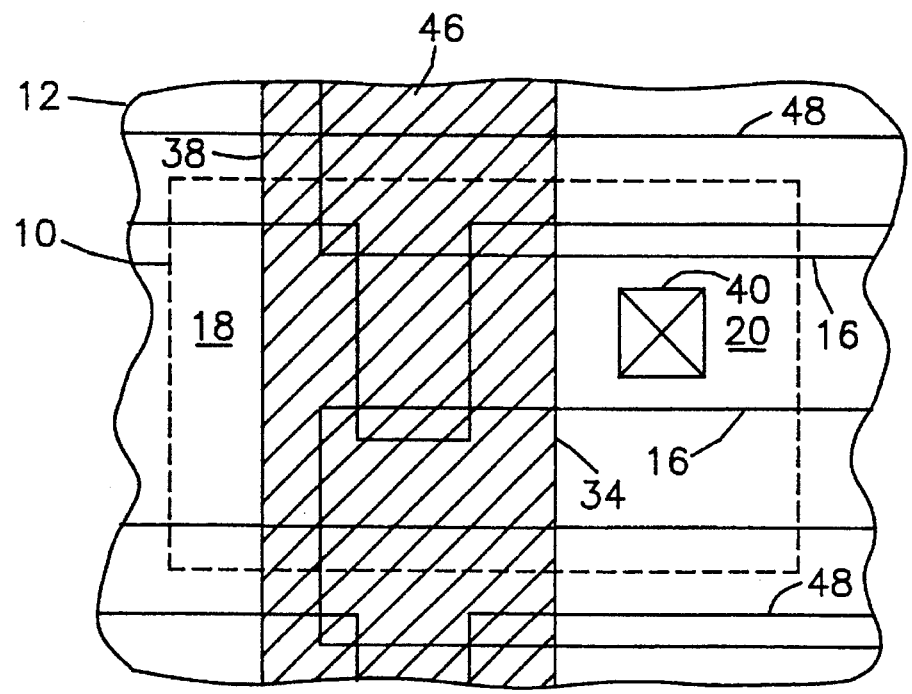
FIG. 4 is similar to FIG. 1 but has the polysilicon control gate (word line) highlighted by diagonal hatching.

FIG. 4 is similar to FIG. 1, but illustrates the control gate 38 highlighted by diagonal hatching. The control gate 38 constitutes a portion of a continuous "word line" 46 which interconnects the control gate 38 of the cell 10 with the control gates of the other cells in the vertical direction as viewed in FIGS. 1 and 4 to 7.

Figure 5:
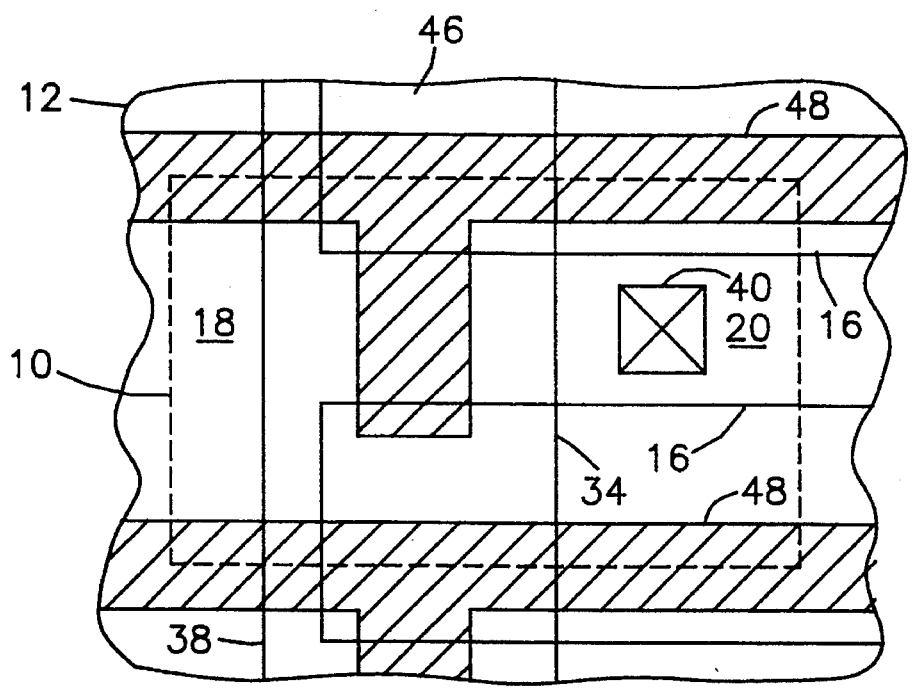
FIG. 5 is also similar to FIG. 1 but has floating polysilicon openings highlighted by diagonal hatching.

FIG. 5 highlights an opening 48 which is cut in the floating polysilicon layer which forms the floating gate 34 to isolate the floating gate 34 from the floating gates of adjacent cells in the vertical direction. The opening 48 is filled with thick oxide during the formation of the gate oxide layers 36 and 36a.

Figure 6:
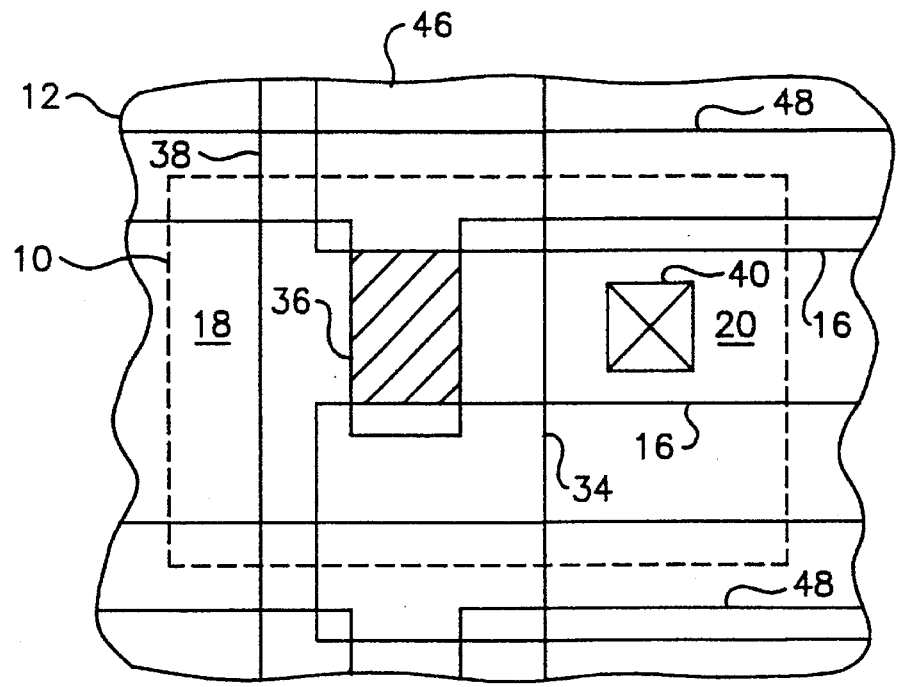
FIG. 6 is also similar to FIG. 1 but has the control-gate oxide region highlighted by diagonal hatching.
Figure 7:
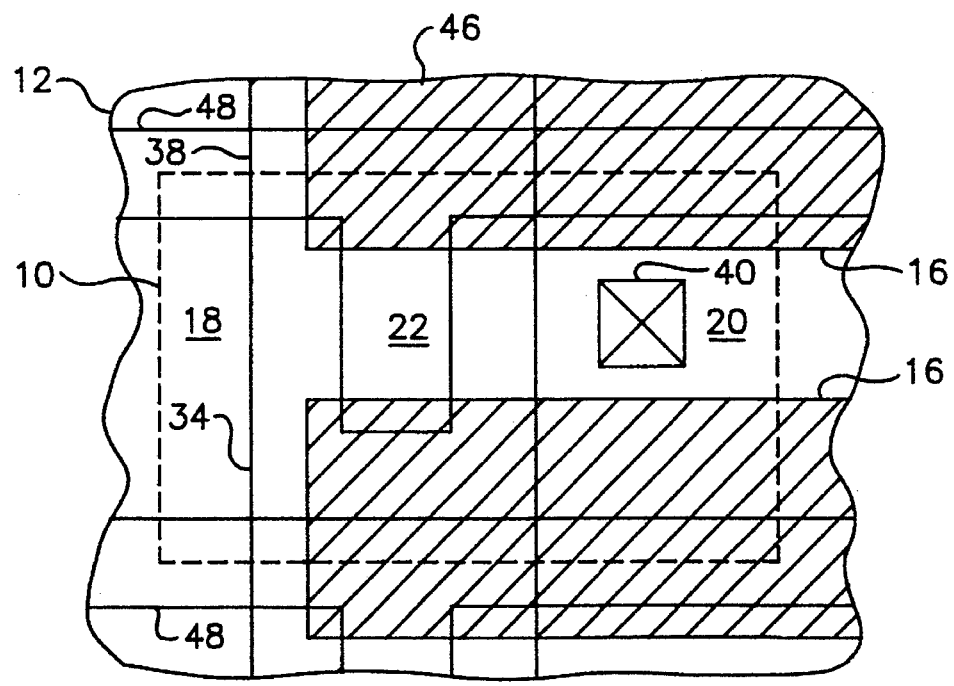
FIG. 7 is also similar to FIG. 1 but has field oxide regions highlighted by diagonal hatching.

FIG. 6 highlights the depressed portion of oxide layer 36 that, along with the underlying portion of tunnel oxide layer 32, forms the control-gate oxide. FIG. 7 highlights the field oxide insulator 16.

Figure 8:
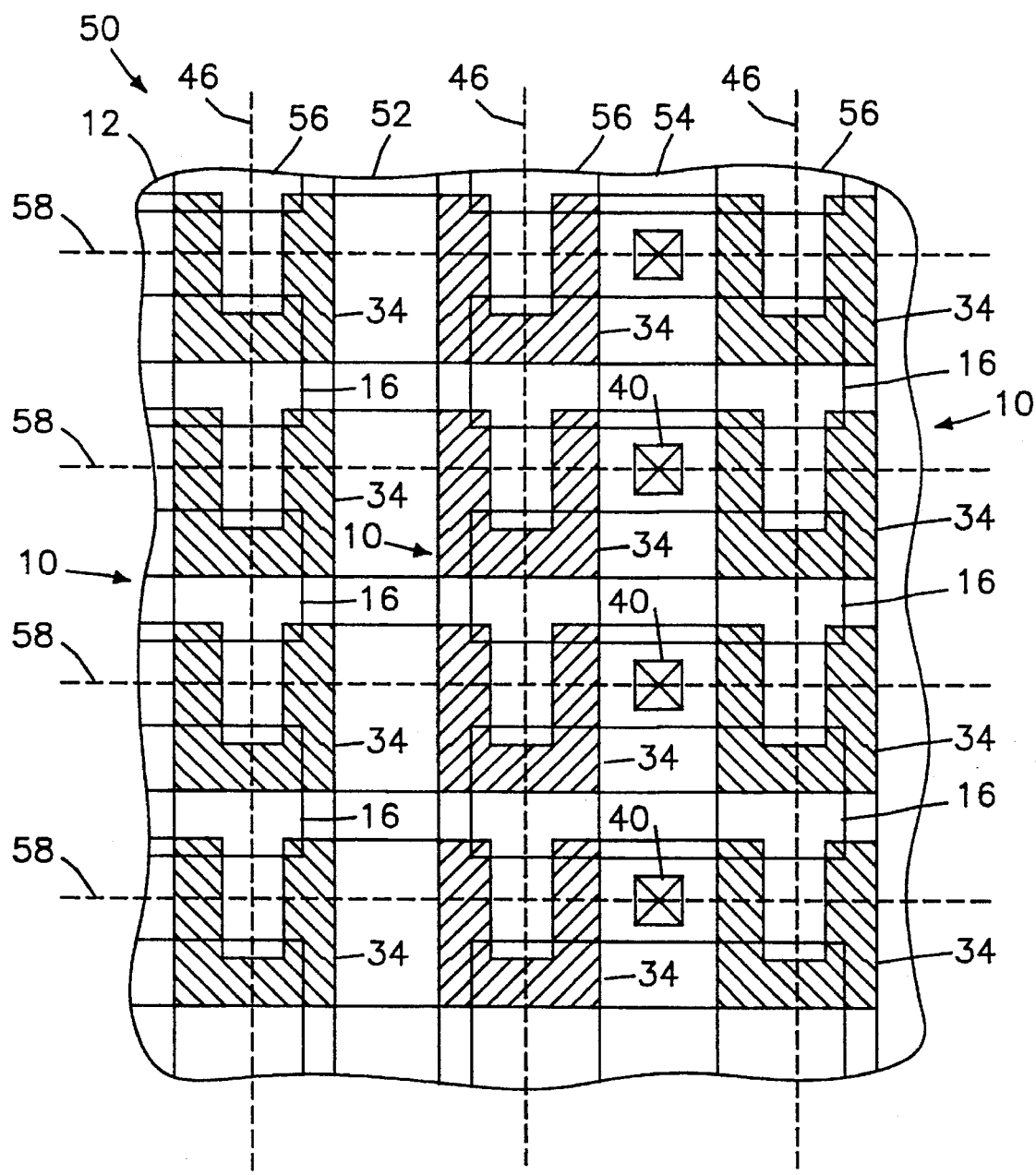
FIG. 8 is a diagram illustrating an EEPROM array embodying the invention which is formed of unit cells as illustrated in FIGS. 1 to 7.

FIG. 8 illustrates an EEPROM array 50 formed of unit cells 10 as illustrated in FIGS. 1 to 7. The array 50 is shown as including three columns of unit cells 10, although it can be expanded to any size within the scope of the invention. The array 50 includes an elongated common source region 52 which is formed in the substrate 12 and extends in a predetermined direction (vertical as viewed in the drawing). A drain region 54 extends parallel to the source region 52. Channel regions 56 are defined between the source and drain regions 52 and 54.

The unit cells 10 are formed on the substrate 12 on the opposite sides of the drain region 54 respectively and are vertically spaced from each other. The cells 10 include all the elements described above with reference to FIGS. 1 to 7. However, only the floating gates 34, field oxide insulators 16 and drain contacts 40 are shown for simplicity of illustration. The cells 10 on opposite sides of the drain region 54 are symmetrical to each other.

The control gates 38 of the cells 10 are interconnected by word lines as indicated by broken lines 46. The drain contacts 40 of cells 10 which are adjacent to each other in the horizontal direction are interconnected by "bit lines" indicated by broken lines 58.

Figure 9:
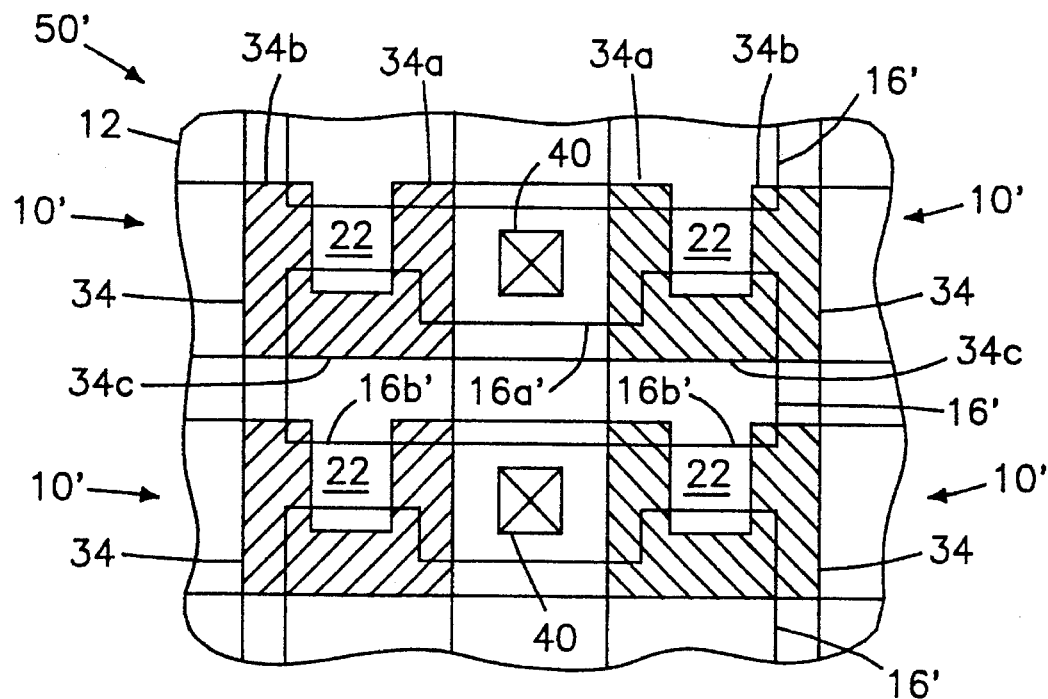
FIG. 9 is a diagram illustrating modified arrangement which enables the size of the array to be reduced in the direction of the word lines.

FIG. 9 illustrates a modified array 50' in which the vertical size (parallel to the word lines 46) is reduced. Although the drain contacts 40 must have a predetermined size as prescribed by the design rules of the fabrication technology, the width of the channel 22 can be reduced from the configuration illustrated in FIG. 8 without adversely affecting the operation of the array 50.

As viewed in FIG. 9, portions 16a' of field oxide insulators 16' which extend through the drain region 54 and insulate the drains 20 of vertically adjacent cells 10' from each other are narrower than portions 16b' of the insulators 16' which define the lower ends of channels 22. This enables the upper portions of the cells 10' to be truncated and the cells 10' to be spaced closer together in the vertical direction than in the array 50. It will be noted that the base 34c and adjacent portions of the arms 34a and 34b of each floating gate 34 overlie the insulators 16'.

Figure 10:
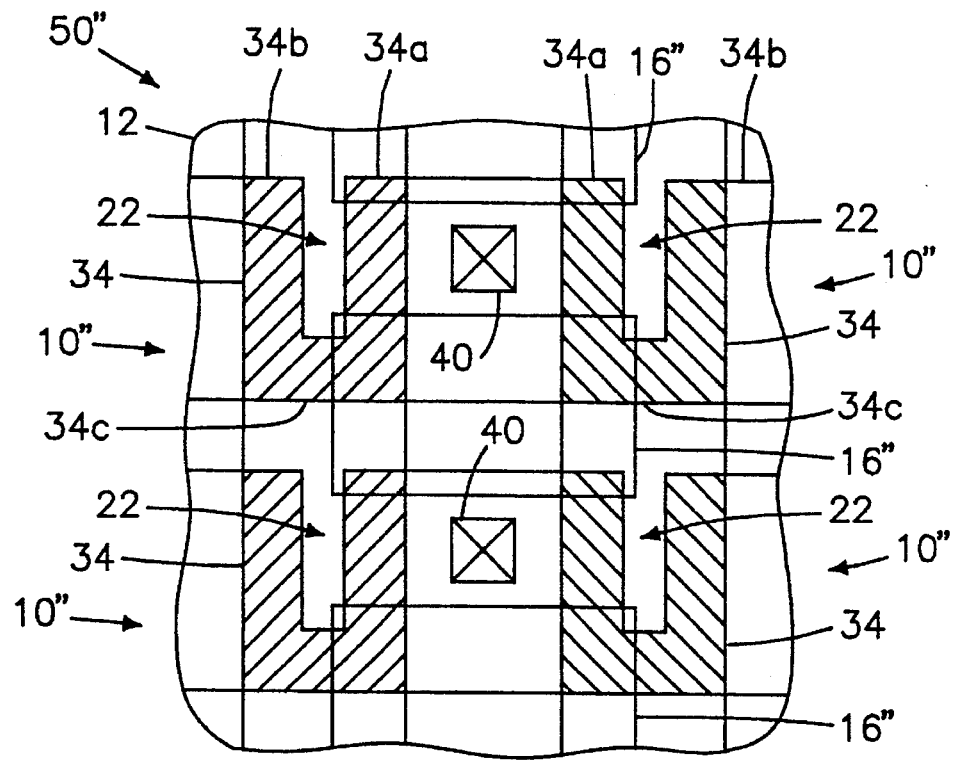
FIG. 10 is similar to FIG. 9, but illustrates a modified arrangement which enables the size of the array to be reduced in the direction perpendicular to the word lines.

FIG. 10 illustrates another modified array 50" in which the horizontal size (parallel to the bit lines 58) is reduced. Whereas in the arrays 50 and 50' the entire base 34c and adjacent portions of both arms 34a and 34b of each floating gate 34 overlie the respective field oxide insulator 16 or 16' in the array 50" only adjacent portions of the program arm 34a and base 34c overlie a respective field oxide insulator 16". This is possible because the adjacent corners of the ONO layer 36a and the respective insulator 16" overlap in the gap region 22c of the channel 22 and provide sufficient insulation between adjacent cells 10'.

While several illustrative embodiments of the invention have been shown and described, numerous variations and alternate embodiments will occur to those skilled in the art, without departing from the spirit and scope of the invention.

For example, although the flash EEPROM cell as described and illustrated has an N-type channel and the hot charge carriers which are injected into the floating gate are electrons, it is within the scope of the invention to provide a P-channel cell in which the injected hot charge carriers are holes. As yet another variation, the modifications of FIGS. 9 and 10 can be combined to reduce the size of the array in both directions.

Accordingly, it is intended that the present invention not be limited solely to the specifically described illustrative embodiments. Various modifications are contemplated and can be made without departing from the spirit and scope of the invention as defined by the appended claims.

We claim:

1. An electrically erasable programmable read-only memory (EEPROM) cell, comprising:

a semiconductor substrate;

a source and a drain formed in the substrate;

a channel which is formed in the substrate between the source and the drain and has a program region extending from the drain toward the source, an erase region extending from the source toward the drain and a gap region between said program and erase regions;

a tunnel insulating layer formed over the substrate;

a bifurcated floating gate which is formed over the tunnel insulating layer and includes:

a program arm overlying said program region of the channel;

an erase arm which overlies said erase region of the channel and overlaps the source; and a base which interconnects the program and erase arms;

a gate insulating layer formed over the program and erase arms of the floating gate and said gap region of the channel; and a control gate which is formed over the gate insulating layer and overlies said program and erase arms of the floating gate and said gap region of the channel.

2. A cell as in claim 1, in which the base extends from the program arm around the channel to the erase arm.

3. A cell as in claim 1, in which the base extends from the program arm around an end of the channel to the erase arm.

4. A cell as in claim 3, further comprising a field insulator formed in the substrate adjacent to said end of the channel, the base extending over the field insulator.

5. A cell as in claim 1, in which the gate insulating layer is thicker than the tunnel insulating layer.

6. A cell as in claim 1, in which the tunnel and gate insulating layers are formed of oxide.

7. A cell as in claim 1, further comprising a field insulator underlying the base and adjacent portions of the program and erase arms.

8. A cell as in claim 1, further comprising a field insulator underlying adjacent portions of the program arm and base.

9. A cell as in claim 1, further comprising a field insulator having a first section which underlies adjacent portions of the program arm and base and a second section for insulating the drain from drains of adjacent cells, the first section being wider than the second section.

10. An electrically erasable programmable read-only memory (EEPROM) array, comprising:

a semiconductor substrate;

an elongated drain region which is formed in the substrate and extends in a predetermined direction; and a plurality of first cells which are formed on the substrate extending from one side of said drain region and are spaced from each other in said predetermined direction; and a plurality of second cells which are formed on the substrate extending from an opposite side of said drain region and are spaced from each other in said predetermined direction;

each of said first and second cells including:
 a drain which constitutes a portion of said drain region;
 a source formed in the substrate;
 a channel which is formed in the substrate between the source and the drain and has a program region extending from the drain toward the source, an erase region extending from the source toward the drain and a gap region between said program and erase regions;
 a tunnel insulating layer formed over the substrate;
 a bifurcated floating gate which is formed over the tunnel insulating layer and includes:
  a program arm overlying said program region of the channel;
  an erase arm which overlies said erase region of the channel and overlaps the source; and
  a base which interconnects the program and erase arms;
 a gate insulating layer formed over the program and erase arms of the floating gate and said gap region of the channel; and
 a control gate which is formed over the gate insulating layer and overlies said program and erase arms of the floating gate and said gap region of the channel.

11. An array as in claim 10, in which each base extends from the program arm around the channel to the erase arm.

12. An array as in claim 10, in which each base extends from the program arm around an end of the channel to the erase arm.

13. An array as in claim 12, in which each of said first and second cells further comprises a field insulator formed in the substrate adjacent to said end of the channel, the base extending over the field insulator.

14. An array as in claim 10, in which the gate insulating layer of each of said first and second cells is thicker than the tunnel insulating layer.

15. An array as in claim 10, in which the tunnel and gate insulating layers of each of said first and second cells are formed of oxide.

16. An array as in claim 10, in which each of said first and second cells further comprises a field insulator underlying the base and adjacent portions of the program and erase arms.

17. An array as in claim 10, in which each of said first and second cells further comprises a field insulator underlying adjacent portions of the program arm and base.

18. An array as in claim 10, in which each of said first and second cells further includes a field insulator having a first section which underlies adjacent portions of the program arm and base and a second section which extends through said drain region and insulates the drain of the respective cell from the drain of an adjacent cell, the first section of the field insulator being wider than the second section thereof.

19. An array as in claim 18, in which the channel section of the field insulator of each of said first and second cells further underlies a portion of the erase arm which is adjacent to the base of the floating gate thereof.

* * * * *